United States Patent
Ono et al.

(10) Patent No.: US 10,410,640 B2
(45) Date of Patent: Sep. 10, 2019

(54) SOUND SOURCE SEPARATION APPARATUS

(71) Applicants: RION Co., Ltd., Tokyo (JP);
Inter-University Research Institute Corporation Research Organization of Information and Systems, Tokyo (JP)

(72) Inventors: Nobutaka Ono, Tokyo (JP); Masahiro Sunohara, Tokyo (JP); Chiho Haruta, Tokyo (JP)

(73) Assignees: RION Co., Ltd., Tokyo (JP);
Inter-University Research Institute Corporation Research Organization of Information and Systems, Tokyo (JP)

( * ) Notice: Subject to any disclaimer, the term of this patent is extended or adjusted under 35 U.S.C. 154(b) by 138 days.

(21) Appl. No.: 15/663,019

(22) Filed: Jul. 28, 2017

(65) Prior Publication Data

US 2018/0040327 A1 Feb. 8, 2018

(30) Foreign Application Priority Data

Aug. 5, 2016 (JP) ................. 2016-155083

(51) Int. Cl.
*G10L 19/008* (2013.01)
*G10L 21/0272* (2013.01)
(Continued)

(52) U.S. Cl.
CPC ............ *G10L 19/008* (2013.01); *G01S 3/808* (2013.01); *G10L 21/0272* (2013.01);
(Continued)

(58) Field of Classification Search
None
See application file for complete search history.

(56) References Cited

U.S. PATENT DOCUMENTS 7,251,271 B1 7/2007 Eriksson
2007/0081677 A1* 4/2007 Nishikawa ........... G10K 11/341
381/98
(Continued)

FOREIGN PATENT DOCUMENTS

JP 2013068938 4/2013
JP 2014041308 3/2014

OTHER PUBLICATIONS

Nesta et al., "Batch-Online Semi-Blind Source Separation Applied to Multi-Channel Acoustic Echo Cancellation" IEEE Transactions on Audio, Speech, and Language Processing, vol. 19, No. 3, Mar. 2011 (Year: 2011).*

(Continued)

*Primary Examiner* — John C Kuan
(74) *Attorney, Agent, or Firm* — Rankin, Hill & Clark LLP (57) ABSTRACT

A sound source separation apparatus includes: a separation-matrix processor that transforms a plurality of observation signals corresponding to sounds being propagated from a plurality of sound sources into a frequency-domain signal group the separation-matrix processor updating a separation matrix based on the frequency-domain signal group and transforming the updated separation matrix into time-series filter coefficients to output; a filter-coefficient transformer that partially removes non-causal components from the filter coefficients to transform the filter coefficients, and a separator that supplies the filter coefficients to a filter group, the separator generating a plurality of separation signals separated from the plurality of observation signals corresponding to the separation matrix.

6 Claims, 7 Drawing Sheets

(51) Int. Cl.
- *H03H 21/00* (2006.01)
- *H04R 3/00* (2006.01)
- *H04R 1/40* (2006.01)
- *H04R 25/00* (2006.01)
- *G01S 3/808* (2006.01)

(52) U.S. Cl.
CPC ......... *H03H 21/0025* (2013.01); *H04R 1/406* (2013.01); *H04R 3/005* (2013.01); *H03H 2021/0034* (2013.01); *H04R 25/407* (2013.01); *H04R 2225/43* (2013.01)

(56) References Cited

U.S. PATENT DOCUMENTS

| | | |
|---|---|---|
| 2009/0254338 A1 | 10/2009 | Chan et al. |
| 2010/0278357 A1 | 11/2010 | Hiroe |
| 2013/0089209 A1* | 4/2013 | Okimoto ............... G10L 19/008 381/22 |
| 2014/0058736 A1 | 2/2014 | Taniguchi et al. |
| 2016/0029120 A1 | 1/2016 | Nesta et al. |

OTHER PUBLICATIONS

European Office Action dated Dec. 11, 2017 for the corresponding European Patent Application No. 17184363.4.
European Search Report dated Nov. 29, 2017 for the corresponding European Patent Application No. 17184363.4.

* cited by examiner

FIG. 1

*FIG. 2*
FILTER COEFFICIENT ha(n)

*FIG. 3*
FILTER COEFFICIENT hb(n)

SOUND SOURCE SEPARATION APPARATUS

CROSS-REFERENCE TO RELATED APPLICATION

This application claims priority from Japanese Patent Application No. 2016-155083 filed with the Japan Patent Office on Aug. 5, 2016, the entire content of which is hereby incorporated by reference.

BACKGROUND

1. Technical Field

The present disclosure relates to a sound source separation apparatus.

2. Description of the Related Art

Generally, there has been known a sound source separation technique for separating or extracting only a sound coming from a target sound source in a space that includes various sound sources. In a common sound source separation technique, the following method is employed. Each of a plurality of microphones located on a space collects a mixed sound that includes sounds from a plurality of sound sources to receive and store a plurality of observation signals. Furthermore, data processing is performed on the observation signals to separate a sound of a target sound source. For example, there has been proposed a technique for stably obtaining a separation matrix that separates a sound of a target sound source offline based on independent vector analysis on the plurality of observation signals (see, for example, JP-A-2013-68938). For example, there has been proposed a technique that estimates an auxiliary variable in updating the separation matrix based on a past observation signal to separate the sound of the target sound source online (see, for example, JP-A-2014-41308).

SUMMARY

A sound source separation apparatus includes: a plurality of microphones that collects sounds to transform into electric signals, the sounds being propagated from a plurality of sound sources; a separation-matrix processor that transforms a plurality of observation signals into a frequency-domain signal group, the plurality of observation signals being outputted from the plurality of microphones in time series, the separation-matrix processor updating a separation matrix configured to separate sounds of the plurality of sound sources based on the frequency-domain signal group, the separation-matrix processor transforming the updated separation matrix into time-series filter coefficients to output; a filter-coefficient transformer that partially removes non-causal components from the filter coefficients to transform the filter coefficients, the non-causal components being included in the time-series filter coefficients; and a separator that supplies the filter coefficients to a filter group, the filter coefficients having been obtained by the transformation by the filter-coefficient transformer, the filter group performing convolution processes of the plurality of observation signals, the separator generating a plurality of separation signals separated from the plurality of observation signals corresponding to the separation matrix.

DESCRIPTION OF THE EMBODIMENTS

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The conventional sound source separation techniques are variously used. For example, a sound source separation technique applicable to a common hearing aid is desired. On the use of the hearing aid, there is a problem that it takes some time (time lag) for an external sound to be outputted from an earphone inside auditory canals of a user after the sound reaches a microphone. For example, it is considered that an estimated tolerance limit for the above time lag is approximately 10 ms for comfortable use of the hearing aid by the user. However, as described above, the technique of the above JP-A-2013-68938 performs the data processing offline. Accordingly, it is not considered to decrease a time period (delay time) from the input of the observation signal to an output of a separation signal. The above JP-A-2014-41308 has the technique configured to perform the data processing online in real-time. However, on a main route of the observation signal, a Fourier transformation processor and an inverse Fourier transformation processor are interposed. This generates the delay time for approximately several hundred ms in total. Then, it is difficult for the technique in JP-A-2014-41308 to be applied to the hearing aid.

It is one object of the present disclosure to provide the following sound source separation apparatus. The sound source separation apparatus ensures maintaining a sound separation performance while reducing the delay time in separating the sound online when the sound of the target sound source is separated from the mixed sound that includes sounds from a plurality of the sound sources including the target sound source.

The sound source separation apparatus (1; this sound source separation apparatus) according to one aspect of the present disclosure includes a plurality of microphones (10 and 11), a separation-matrix processor (20), a filter-coefficient transformer (30), and a separator (40). The plurality of microphones (10 and 11) collects sounds to transform into respective electric signals, the sounds are propagated from a plurality of sound sources. The separation-matrix processor (20) transforms a plurality of observation signals (x1 (n) and x2 (n)) into a frequency-domain signal group (x1 ($\omega$) and x2 ($\omega$)), the plurality of observation signals (x1 (n) and x2 (n)) is outputted from the plurality of microphones in time series, the separation-matrix processor (20) updates a separation matrix (W ($\omega$)) for separating sounds of the plurality of sound sources based on the frequency-domain signal group, the separation-matrix processor (20) transforms the updated separation matrix into time-series filter coefficients (ha (n)) to output. The filter-coefficient transformer (30) partially removes non-causal components from the filter coefficients to transform the filter coefficients, the non-causal components are included in the time-series filter coefficients. The separator (40) supplies the filter coefficients (h (n)) to a filter group (41 to 44), the filter coefficients (h (n)) has been obtained by the transformation by the filter-coefficient transformer, the filter group (41 to 44) performs convolution processes of the plurality of observation signals, the separator (40) generates a plurality of separation signals (y1 (n) and y2 (n)) separated from the plurality of observation signals corresponding to the separation matrix.

According to this sound source separation apparatus, the plurality of observation signals obtained via the plurality of microphones is outputted to branched side branches. On the side branch sides, the update processes of the separation matrix in the frequency domain are performed. Furthermore, the non-causal components are partially removed from the time-domain filter coefficients corresponding to the updated separation matrix. The filter coefficients from which the non-causal components are partially removed are supplied to the filter group in the separator. Accordingly, the separator located on main routes of the plurality of observation signals does not directly update the separation matrix. Furthermore, the separator uses shortened filter coefficients. Then, this sound source separation apparatus ensures operations online while maintaining a sound separation performance and significantly reducing a delay time in propagating the signals.

This sound source separation apparatus may further include a plurality of receivers that transforms each of the plurality of separation signals generated by the separator into sounds. For example, assuming a common hearing aid, this sound source separation apparatus is applicable to a hearing aid that includes receivers for outputting sounds to external auditory canals of a user.

The separation-matrix processor of this sound source separation apparatus may include a short-time Fourier transformer that transforms each of the plurality of observation signals into the frequency-domain signal group, a separation-matrix updater that updates the separation matrix based on the frequency-domain signal group, and an inverse Fourier transformer that transforms the separation matrix into the time-series filter coefficients. In this case, in the frequency domain from the short-time Fourier transformer to the inverse Fourier transformer, the separation matrix is updated. Then, data processing that has a little influence on the delay time is realized.

The filter-coefficient transformer of this sound source separation apparatus may include a circular shifter that performs circular shifts on the filter coefficients generated by the separation-matrix processor, and a filter-coefficient remover that removes a predetermined part of the non-causal components from the filter coefficient on which the circular shift has been performed. In this case, the filter-coefficient remover preferably removes the predetermined part so as to leave a predetermined count of samples in time series near a center among the non-causal components. Selectively removing the predetermined part of the non-causal components that have a comparatively little contribution to the separation performance ensures shortening the filter coefficients. As a result, the delay time in the separator can be reduced.

In this sound source separation apparatus, a count of the predetermined count of samples to be left among the non-causal components is preferably set to a count of samples corresponding to a time period not exceeding 10 ms. The upper limit of the acceptable value for the delay time in the common hearing aid is approximately 10 ms. Then, the count of samples to be left configured as described above ensures the performance of the hearing aid when this sound source separation apparatus is applied to the hearing aid.

The separator of this sound source separation apparatus may include a plurality of FIR filters corresponding to elements of the separation matrix, and a plurality of adders that add outputs of the plurality of FIR filters corresponding to additions of separation processing with the separation matrix. In this case, disposing K×M pieces of the FIR filter and M pieces of the adder corresponding to the K×M separation matrix ensures the separator of the time domain. When the separation matrix is a 2×2 matrix, the separator includes, for example, four FIR filters and two adders (see FIG. 1).

As described above, according to this sound source separation apparatus, the separation processing in the frequency domain is performed on the side branch side. Furthermore, the non-causal components of the time-domain filter coefficients are partially removed. Then, the filter coefficients from which the non-causal components are partially removed are supplied to the filter group in the separator. Thus, the delay time in propagating the signals can be significantly reduced without deteriorating the separation performance. Accordingly, the sound source separation can be performed online and in real-time. Accordingly, the sound source separation apparatus appropriate for applying to the hearing aid or any other appropriate devices can be realized.

The following describes the sound source separation apparatus according to one embodiment of the present disclosure by referring to attached drawings. However, the following embodiments are exemplary embodiments to which the technical idea of the present disclosure is applied. The technical idea of the present disclosure is not limited to the contents of the embodiments.

Figure 1:
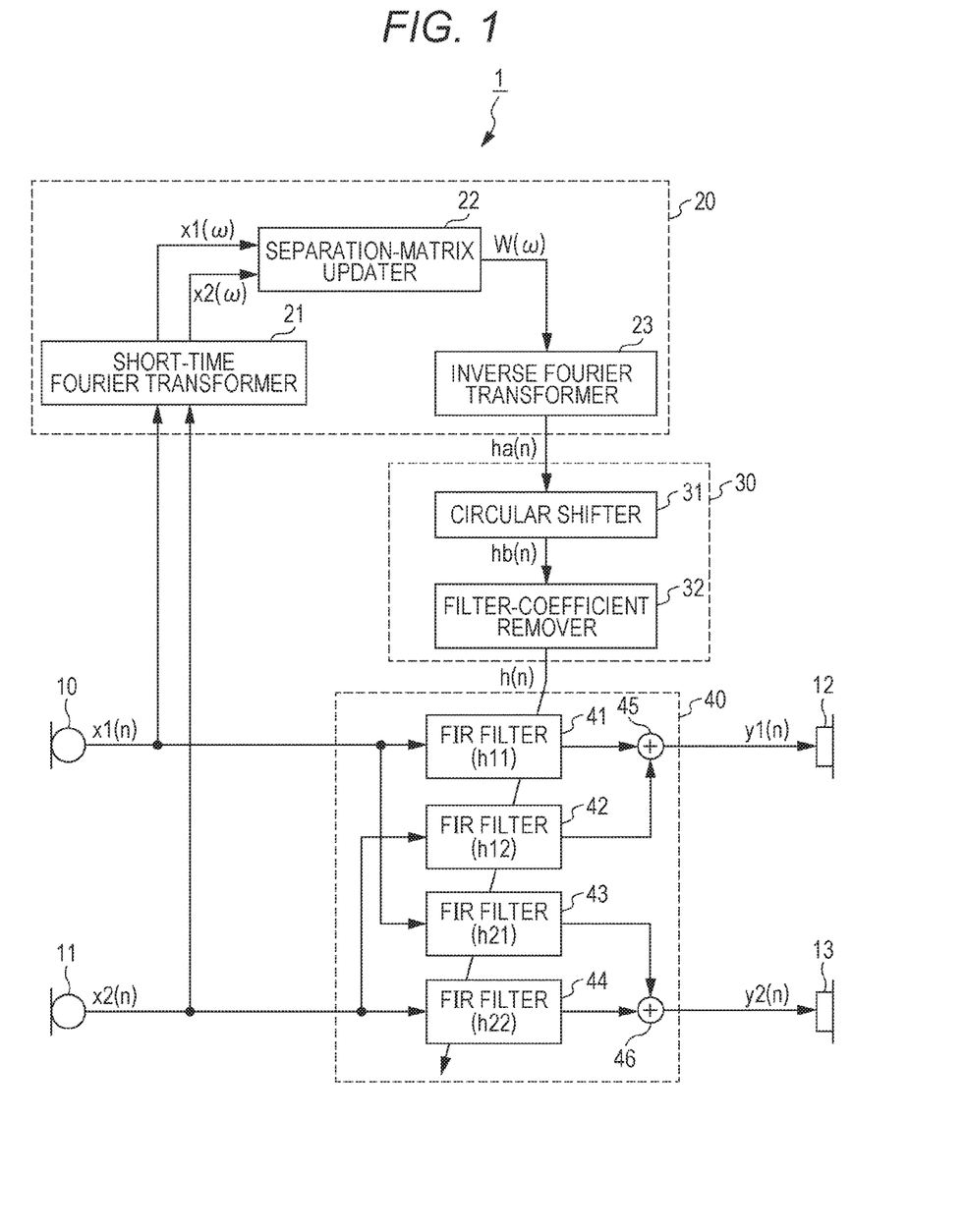
FIG. 1 is a block diagram illustrating an exemplary schematic structure of a sound source separation apparatus according to one embodiment of the present disclosure.

FIG. 1 is a block diagram illustrating an exemplary schematic structure of a sound source separation apparatus 1 according to the embodiment. The sound source separation apparatus 1 separates or extracts a sound of a target sound source from a mixed sound including sounds from a plurality of sound sources. The sound source separation in this description means to separate or extract the sound of the target sound source from the mixed sound including the sounds from the plurality of sound sources.

The sound source separation apparatus 1 of FIG. 1 includes two microphones 10 and 11, two receivers 12 and 13, a short-time Fourier transformer 21, a separation-matrix updater 22, an inverse Fourier transformer 23, a circular shifter 31, a filter-coefficient remover 32, four FIR filters 41, 42, 43, and 44, and two adders 45 and 46. The short-time Fourier transformer 21, the separation-matrix updater 22, and the inverse Fourier transformer 23 are included in a separation-matrix processor 20. The circular shifter 31 and the filter-coefficient remover 32 are included in a filter-coefficient transformer 30. The FIR filters 41, 42, 43, and 44, and the adders 45 and 46 are included in a separator 40.

In the above structure, the microphones 10 and 11 are each arranged on two different observation positions in a space including a plurality of sound sources. The microphones 10 and 11 collect inputted sounds (sounds propagated from the plurality of sound sources) to transform into electric signals. In FIG. 1, one microphone 10 outputs a time-series observation signal x1 (n). The other microphone 11 outputs a time-series observation signal x2 (n). The separator 40, described below, separates separation signals y1 (n) and y2 (n), which are signals corresponding to sounds inferred to be the sounds of the respective sound sources, from the observation signals x1 (n) and x2 (n) outputted from the microphones 10 and 11. Then, one receiver 12 transforms the separation signal y1 (n) into a sound to output, while the other receiver 13 transforms the separation signal y2 (n) into a sound to output. Instead of a pair of the receivers 12 and 13, one receiver and a changeover switch (not illustrated) may be employed. In this case, the changeover switch may switch the separation signals y1 (n) and y2 (n) outputted to the receiver. Furthermore, the receiver may transform each of the input separation signals y1 (n) and y2 (n) into sounds to output. Alternatively, the separation signals y1 (n) and y2 (n) are allowed to be directly retrieved into other equipment to be processed. In this case, the pair of the receivers 12 and 13 of FIG. 1 may be omitted.

As illustrated in FIG. 1, the separator 40 is located on main routes from the microphones 10 and 11 to the receivers 12 and 13. Furthermore, the separation-matrix processor 20 and the filter-coefficient transformer 30 are located on routes (side branches) in parallel to the main routes. This structure avoids an influence of the time lag due to the process on the above side branches on the process for obtaining the separation signals y1 (n) and y2 (n) based on the observation signals x1 (n) and x2 (n). Then, the delay time as a time period from the reach of the sound on the microphones 10 and 11 to the output of the sound from the receivers 12 and 13 can be reduced. The delay time of the sound source separation apparatus 1 of this embodiment will be described later in detail.

As illustrated in FIG. 1, the observation signals x1 (n) and x2 (n), which are outputted from the microphones 10 and 11, are inputted to the short-time Fourier transformer 21 of the separation-matrix processor 20 via the side branches branched from the main routes.

The separation-matrix processor 20 transforms the plurality of observation signals x1 (n) and x2 (n), which are outputted from the microphones 10 and 11 in time series, into a frequency-domain signal group. Furthermore, the separation-matrix processor 20 updates the separation matrix for separating the sounds of the plurality of sound sources based on the frequency-domain signal group. The separation-matrix processor 20 transforms the updated separation matrix into time-series filter coefficients to output.

The short-time Fourier transformer 21 transforms each of the plurality of observation signals x1 (n) and x2 (n) into the frequency-domain signal group. That is, the short-time Fourier transformer 21 multiplies the respective time-series observation signals x1 (n) and x2 (n) by a predetermined window function while shifting the respective time-series observation signals x1 (n) and x2 (n), so as to perform short-time Fourier transform processes. Thus, the short-time Fourier transformer 21 generates frequency-domain observation signals (the frequency-domain signal group) x1 (ω) and x2 (ω). In the short-time Fourier transformer 21, a predetermined number of continuous samples of the observation signals x1 (n) and x2 (n) are collectively used as targets for the transform process. The observation signals x1 (ω) and x2 (ω), which are generated by the short-time Fourier transformer 21, are inputted to the separation-matrix updater 22.

The separation-matrix updater 22 updates a separation matrix W (ω) for separating the sounds of the plurality of sound sources based on the observation signals (the frequency-domain signal group) x1 (ω) and x2 (ω). That is, the separation-matrix updater 22 updates the separation matrix W (ω) for generating the separation signals y1 (ω) and y2 (ω) based on the observation signals x1 (ω) and x2 (ω). In the example in FIG. 1, the separation matrix W (ω) is indicated as a 2×2 matrix. In the frequency domain, the following formula (1) is satisfied between an observation signal vector x (ω) and a separation signal vector y (ω).

$$\left.\begin{array}{l} y(\omega) = W(\omega)x(\omega) \\ x(\omega) = [x1(\omega), x2(\omega)]^T \\ y(\omega) = [y1(\omega), y2(\omega)]^T \\ W(\omega) = \begin{bmatrix} W_{11}(\omega) & W_{12}(\omega) \\ W_{21}(\omega) & W_{22}(\omega) \end{bmatrix} \end{array}\right\} \quad (1)$$

Note that T indicates a matrix transposition.

The separation-matrix updater 22 is configured to use various separation algorithms. The separation-matrix updater 22 is configured to perform, for example, a well-known independent vector analysis. The independent vector analysis is a method for updating the separation matrix such that the separation signal vectors in the frequency domain are statistically independent from one another. The independent vector analysis provides an advantage to avoid a permutation problem where the separation signals in respective frequency bandwidths are rearranged in association with the respective sound sources, in principle.

Here, assume to execute the independent vector analysis in a condition including K pieces of the sound source and M pieces of the observation point. In this case, provided that the number of elements of the observation signal vector x (ω) is M, and the number of elements of the separation signal vector y (ω) is K, the K×M separation matrix W (ω) is updated. In this case, FIG. 1 illustrates an exemplary structure corresponding to a case of K=M=2. The separation algorithm by the independent vector analysis concludes in process for minimizing an objective function J (W) indicated by the following formula (2).

$$J(W) = \sum_{k=1}^{K} E[G(y_k)] - \sum_{\omega=1}^{N_\omega} \log|\det W(\omega)| \quad (2)$$

Note that,

W: separation matrix where every frequency of the separation matrix W (ω) is collected E [·]: expected value for time t G [·]: G(y (ω))=−log q (y (ω)) (function that uses probability density function q [·] of sound source)

$y_k$: separation signal vectors of every frequency $N_\omega$: upper limit of frequency The objective function J (W) in the formula (2) is minimized by setting a predetermined step size η and sequentially updating W with using a correction amount ΔW obtained by data processing with the following formula (3).

$$W \leftarrow W - \eta \Delta W \quad (3)$$

There are various data processing algorithms for minimizing the objective function J (W) in the formula (2). As the data processing algorithm, for example, an auxiliary function method is available from an aspect of improving a convergence velocity. The auxiliary function method is a method that minimizes an auxiliary function set as the above objective function J (W) to obtain the separation matrix W that decreases the objective function J (W). The auxiliary function method has a feature where the convergence is fast.

Next, with reference to FIG. 1 again, the separation matrix W (ω), which is updated by the separation-matrix updater 22, is inputted to the inverse Fourier transformer 23. The inverse Fourier transformer 23 transforms the separation matrix W (ω) into the time-series filter coefficients. That is, the inverse Fourier transformer 23 performs inverse Fourier transform process on each element of the separation matrix W (ω) to generate a time-domain filter coefficient ha (n). Specifically, four time-domain filter coefficients ha11 (n), ha12 (n), ha21 (n), and ha22 (n) are generated based on W11 (ω), W12 (ω), W21 (ω), and W22 (ω) as the elements of the 2×2 separation matrix W (ω). The following description uses notations of the filter coefficient ha (n) as a representative of each of the above four filter coefficients ha11 (n), ha12 (n), ha21 (n), and ha22 (n).

Next, the filter coefficient ha (n), which is generated by the inverse Fourier transformer 23, is inputted to the circular shifter 31 of the filter-coefficient transformer 30.

The filter-coefficient transformer 30 partially removes non-causal components included in the time-series filter coefficients from the filter coefficients to transform the filter coefficients.

The circular shifter 31 performs what is called a circular shift on the filter coefficient ha (n). Thus, the circular shifter 31 generates and outputs a filter coefficient hb (n) shifted in the time domain. Specifically, the circular shifter 31 sequentially performs transformation indicated by the following formula (4) on the time-series filter coefficients ha (1) to ha (N) corresponding to N pieces of sample (n=1 to N).

$$\left.\begin{array}{l} hb(1) \leftarrow ha\left(\frac{N}{2}+1\right) \\ hb(2) \leftarrow ha\left(\frac{N}{2}+2\right) \\ \vdots \\ hb\left(\frac{N}{2}\right) \leftarrow ha(N) \\ hb\left(\frac{N}{2}+1\right) \leftarrow ha(1) \\ \vdots \\ hb(N) \leftarrow ha\left(\frac{N}{2}\right) \end{array}\right\} \quad (4)$$

Figure 2:
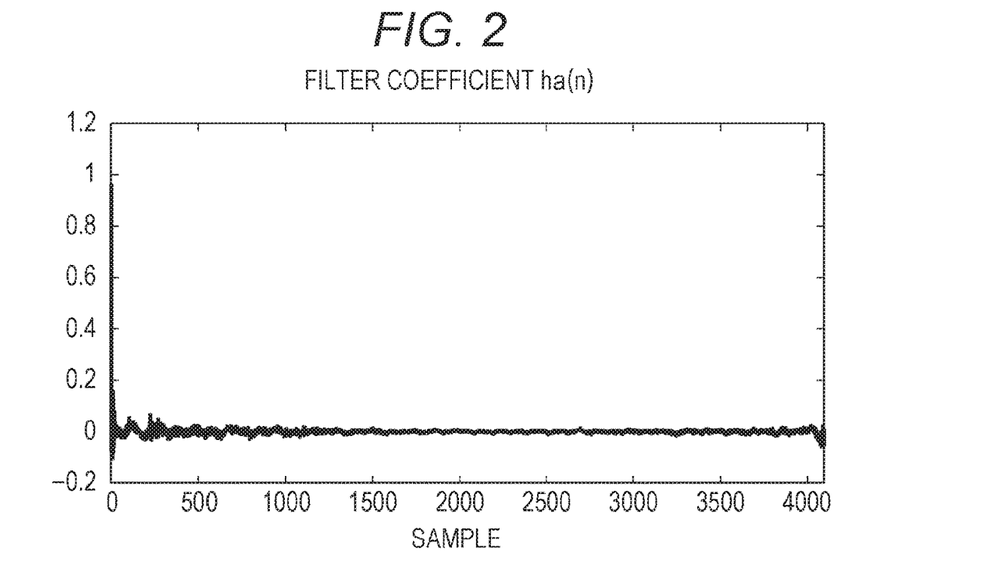
FIG. 2 illustrates an exemplary waveform of a filter coefficient outputted from an inverse Fourier transformer.
Figure 3:
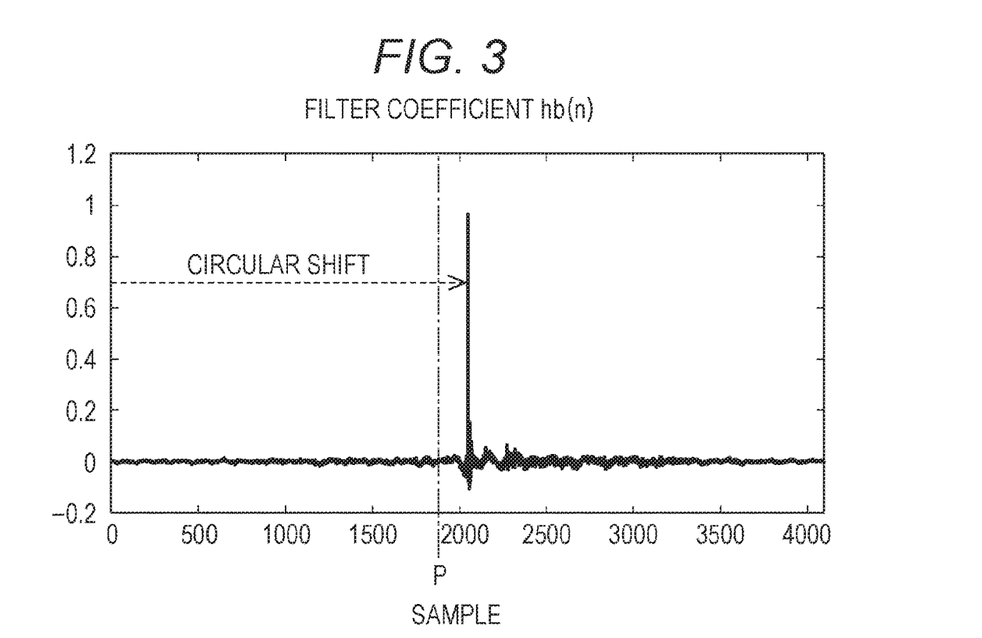
FIG. 3 illustrates an exemplary waveform of a filter coefficient outputted from a circular shifter.

Here, FIG. 2 illustrates an exemplary waveform of the filter coefficient ha (n) outputted from the inverse Fourier transformer 23. FIG. 3 illustrates an exemplary waveform of a filter coefficient hb (n) outputted from the circular shifter 31. In FIGS. 2 and 3, a horizontal axis indicates a sample (n). The number of samples on the whole horizontal axis is set to "N=4096." A level of a vertical axis is standardized in order to be in a range of −1 to 1. In FIG. 2, n=0 is indicated. This part actually includes no data, and the same applies to the following diagrams. First, the filter coefficient ha (n) of FIG. 2 is similar to a waveform of an impulse signal, and many components concentrate on the proximity of n=1 and n=N. Then, when the circular shifter 31 cyclically shifts the filter coefficient ha (n), a half part on a right side of FIG. 2 shifts to a left side part of n=1 of FIG. 2. As a result, as illustrated in FIG. 3, the waveform of the filter coefficient hb (n) after the transformation (shifted) has a symmetrical waveform in which the components concentrate on an approximately center in a range of n=1 to N. The circular shift is a process executed prior to a time-domain convolution process performed in the separator 40 described below.

Figure 4:
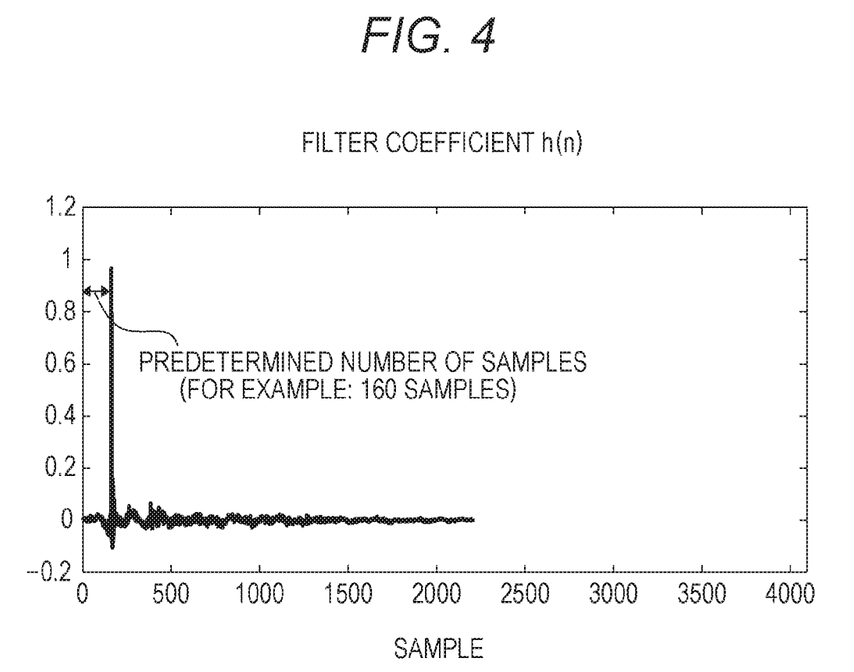
FIG. 4 illustrates an exemplary waveform of a filter coefficient after transformed by a filter-coefficient remover.

Next, the filter coefficient hb (n) obtained by the circular shift by the circular shifter 31 is inputted to the filter-coefficient remover 32. The filter-coefficient remover 32 removes a predetermined part of the non-causal component from the filter coefficient hb (n) obtained by the circular shift. Thus, the filter-coefficient remover 32 generates a filter coefficient h (n) including a reduced number of samples. Here, above-described FIG. 3 indicates a position P. The filter-coefficient remover 32 removes a left side part of the position P of FIG. 3. FIG. 4 illustrates an exemplary waveform of the filter coefficient h (n) after transformed by the filter-coefficient remover 32. In FIG. 4, the notations of the vertical axis and the horizontal axis are similar to FIGS. 2 and 3.

With reference to FIG. 3 again, when a sample of the filter coefficient hb (n) at a center (n=2048) is assumed to be a sample of the time t=0, a filter processing performed on a later half range of the time domain (a right side range of the center) is configured to use past samples in time series. Accordingly, this range is regarded as a range with causality. On the other hand, a filter processing performed on a former half range of the time domain (a left side range of the center) is configured to use future samples in time series. Accordingly, this range is regarded as a range with non-causality (non-causal component). In this embodiment, the filter-coefficient remover 32 removes the part where a predetermined number of samples are removed from the samples of the non-causal components among the input filter coefficients hb (n). This confirms the delay time in accordance with the data processing to be reduced.

The filter coefficient hb (n) from which every non-causal component is removed causes a performance degradation on the sound source separation. In view of this, a predetermined number of samples among the non-causal components are left near the center in time series. That is, the filter-coefficient remover 32 removes the predetermined part of the non-causal components so as to leave the predetermined number of samples among the non-causal components near the center in time series. For example, in an example in FIG. 4, a part including 160 samples near the position P in FIG. 3 is left, and a left side range of the part is removed. In this case, assume that a total number of samples is N=4096, and the number of samples as removal targets is 4096/2−160=1888. As a result, the number of samples of the filter coefficient h (n) is 4096/2+160=2208.

Here, when the sound source separation apparatus 1 of this embodiment is applied to a hearing aid, preferably, the number (predetermined number of samples) of samples being left among the above non-causal components is set to the number of samples corresponding to a time period not exceeding 10 ms. When the above predetermined number of samples exceeds corresponding to 10 ms in terms of time, the time period (the delay time) from the reach of the sound to the microphones 10 and 11 to the output of the sound from the receivers 12 and 13 also exceeds 10 ms. It is well-known that an acceptable value of the delay time on a common hearing aid does not exceed 10 ms. That is, the above predetermined number of samples set to be a time period exceeding 10 ms causes to provide uncomfortable feelings to a user of the hearing aid to which the sound source separation apparatus 1 of this embodiment is applied. On the other hand, a lower limit value of the number (predetermined number of samples) of the predetermined number of samples being left among the above non-causal components relates to separation performance. The lower limit value is appropriately configured corresponding to conditions of a usage condition of the hearing aid, the separation performance, and the like.

The separator 40 supplies the filter coefficients h (n), which are obtained by the transformations by the filter-coefficient transformer 30, to a filter group that performs the convolution process of a plurality of the observation signals x1 (n) and x2 (n), thus generating a plurality of the separation signals separated from the plurality of observation signals x1 (n) and x2 (n) corresponding to the separation matrix W (ω). That is, the filter coefficients h (n), obtained by the filter-coefficient remover 32, after the transformation (a part of the sample is removed) is supplied to the FIR filters 41 to 44 included in the separator 40. Specifically, a filter coefficient h11 (n) is supplied to the FIR filter 41. A filter coefficient h12 (n) is supplied to the FIR filter 42. A filter coefficient h21 (n) is supplied to the FIR filter 43. A filter coefficient h22 (n) is supplied to the FIR filter 44. Among the FIR filters, to two FIR filters 41 and 43, the time-series observation signal x1 (n) is inputted. To two FIR filters 42 and 44, the time-series observation signal x2 (n) is inputted.

The FIR filters 41 to 44 (the filter group) correspond to the elements of the separation matrix W (ω). The FIR filters 41 to 44 perform the convolution process of the plurality of observation signals x1 (n) and x2 (n). That is, the FIR filters 41 to 44 have roles to perform the convolution process in the time domain corresponding to the respective products included in the above formula (1) in the frequency domain.

Subsequently, on positions after the FIR filters 41 to 44, two adders 45 and 46 are disposed. The adders 45 and 46 add outputs from the plurality of FIR filters 41 to 44 (results of the convolution process by the respective FIR filters 41 to 44) corresponding to the addition in separation processing with the separation matrix (ω). One adder 45 adds the respective outputs from the two FIR filters 41 and 42 to output the addition result as the separation signal y1 (n). The other adder 46 adds the respective outputs from the two FIR filters 43 and 44 to output the addition result as the separation signal y2 (n). The adders 45 and 46 have roles to perform the additions in the frequency domain included in the above formula (1) in the time domain.

Thus, the FIR filters 41 to 44 and the adders 45 and 46 generate a plurality of the separation signals y1 (n) and y2 (n) separated from the plurality of observation signals x1 (n) and x2 (n) corresponding to the separation matrix W (ω). Among the separation signals y1 (n) and y2 (n) obtained by the FIR filters 41 to 44 and the adders 45 and 46, one separation signal y1 (n) is transformed into a sound via the receiver 12, and the other separation signal y2 (n) is transformed into a sound via the receiver 13.

The separation processing in the separator 40 is indicated by the following formulas (5) and (6) with the observation signals x1 (n) and x2 (n) as inputs, the separation signals y1 (n) and y2 (n) as outputs, and the number of taps as T.

$$y_1(n) = \sum_{\tau=1}^{T} h_{11}(\tau)x_1(n-\tau) + \sum_{\tau=1}^{T} h_{12}(\tau)x_2(n-\tau) \quad (5)$$

$$y_2(n) = \sum_{\tau=1}^{T} h_{21}(\tau)x_1(n-\tau) + \sum_{\tau=1}^{T} h_{22}(\tau)x_2(n-\tau) \quad (6)$$

The exemplary structure of the sound source separation apparatus 1 in FIG. 1 depends on an assumption to correspond to the two observation signals x1 (n) and x2 (n), the two separation signals y1 (n) and y2 (n), and the 2×2 separation matrix W (ω). Instead of this, more generally, the technique of the present disclosure is applicable to a sound source separation apparatus configured to separate a sound source based on M pieces of observation signal x (n), K pieces of separation signal y (n), and a K×M separation matrix W. In this case, in the exemplary structure in FIG. 1, M pieces of microphone and K pieces of receiver are disposed. Furthermore, the separator 40 includes K×M pieces of FIR filter and K pieces of adder.

Figure 5:
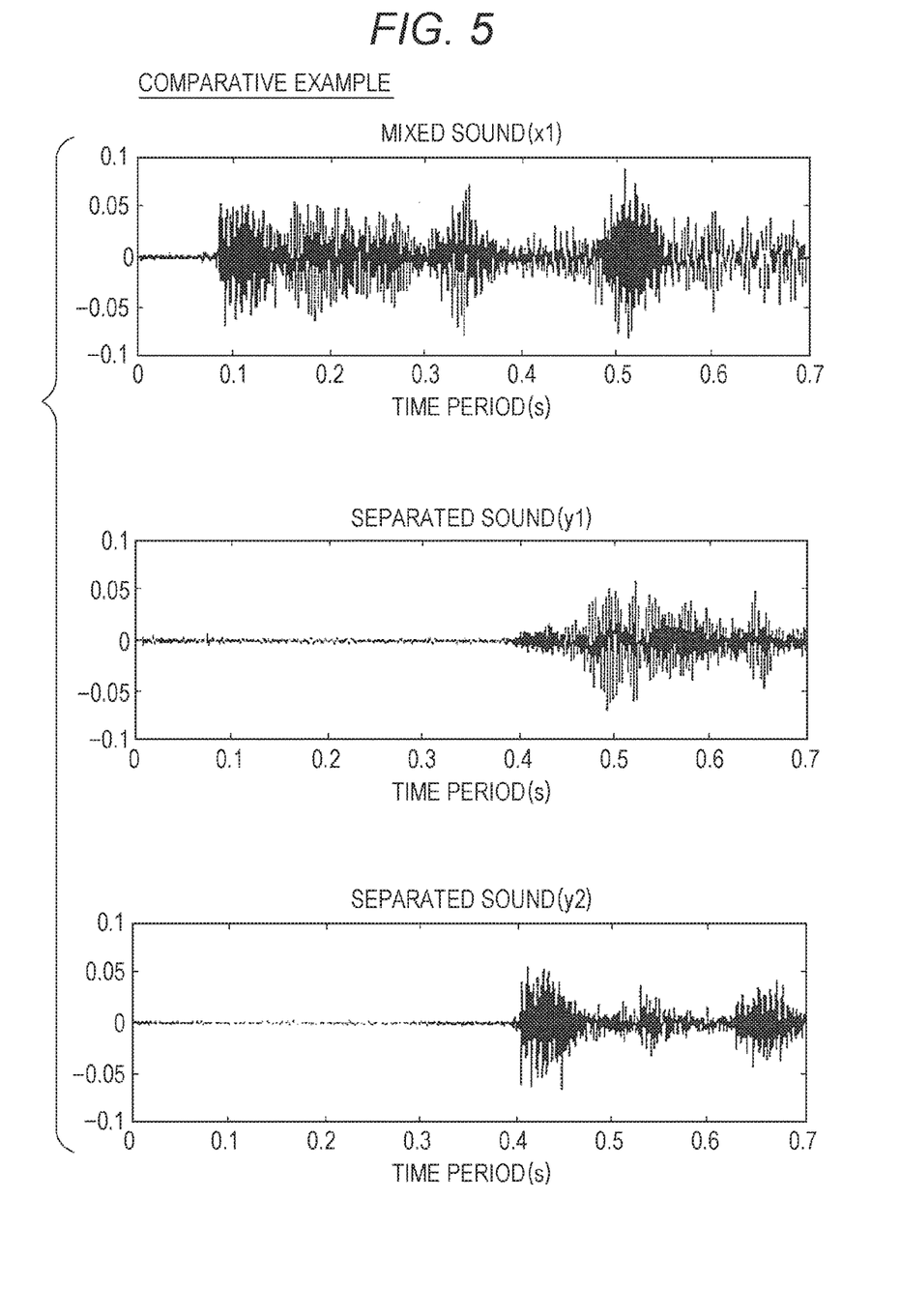
FIG. 5 illustrates a comparative example of a verification result of a simulation by a sound source separation apparatus with a conventional structure for comparison with the embodiment of the present disclosure.
Figure 6:
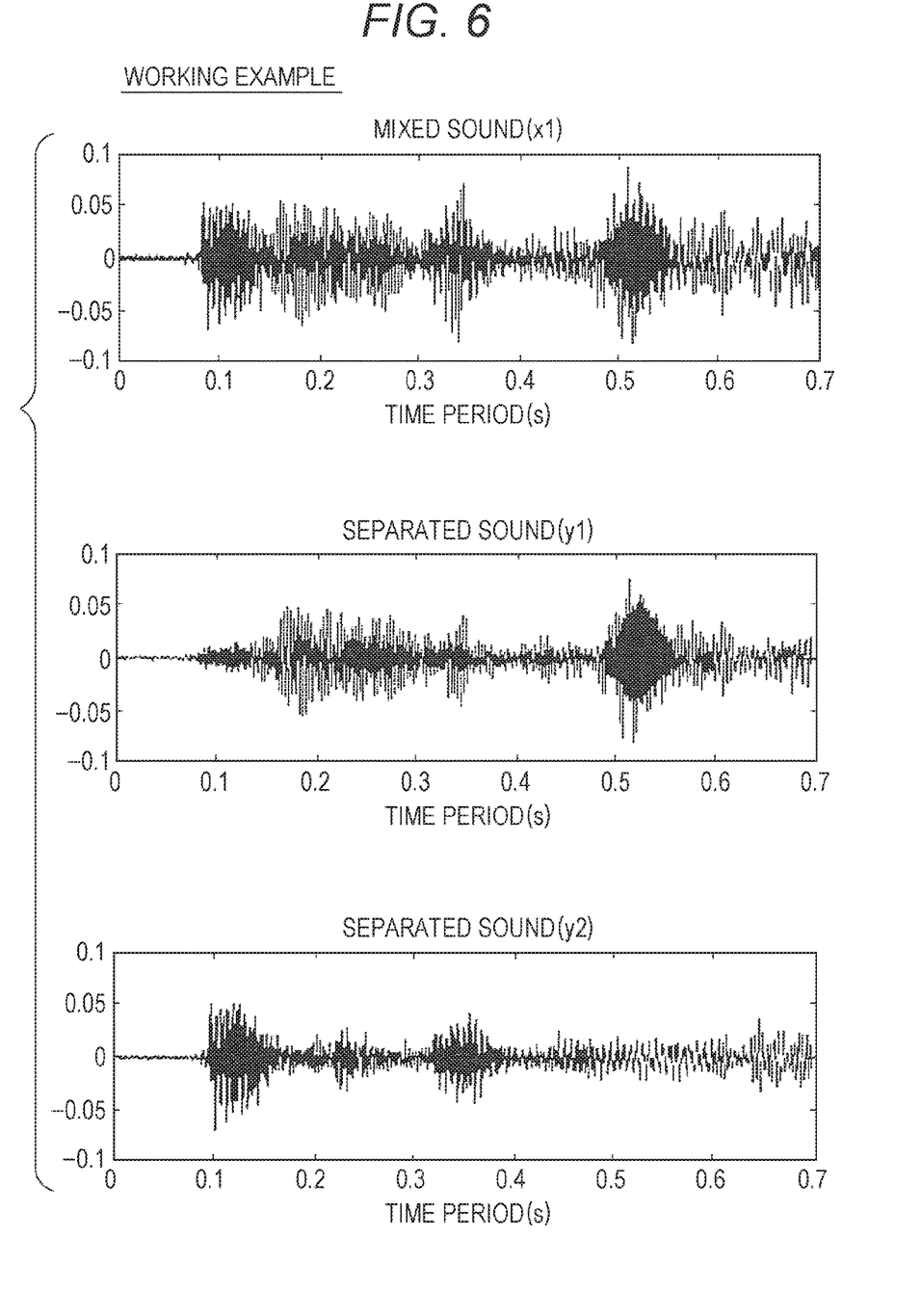
FIG. 6 illustrates a working example of a simulation result similar to FIG. 5 by the sound source separation apparatus of the embodiment.
Figure 7:
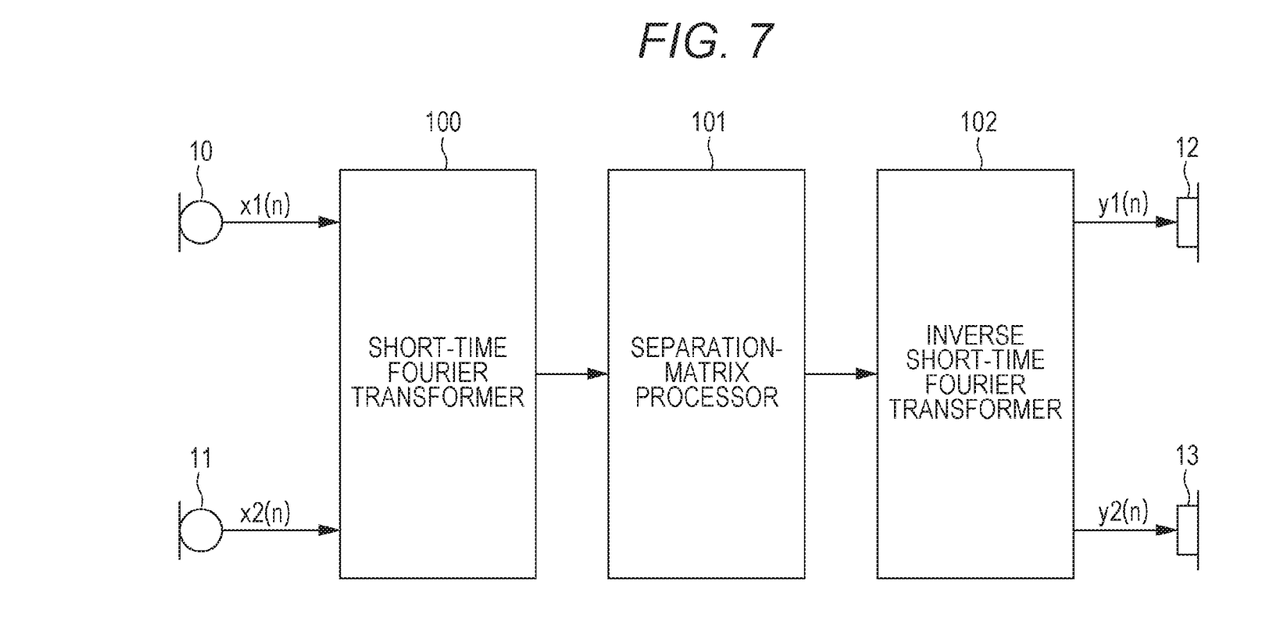
FIG. 7 is a block diagram illustrating an outline of the sound source separation apparatus with the conventional structure used in the comparative example illustrated in FIG. 5.

Next, a description will be given of advantageous effects of the sound source separation apparatus 1 of this embodiment with reference to FIGS. 5 to 7. FIG. 5 illustrates a comparative example of a verification result of a simulation by a sound source separation apparatus with a conventional structure for comparison with this embodiment. FIG. 6 illustrates a working example of a verification result of the similar simulation by the sound source separation apparatus 1 of this embodiment. Here, FIG. 7 is a block diagram illustrating an outline of the sound source separation apparatus with the conventional structure used in the comparative example in FIG. 5. That is, the conventional structure illustrated in FIG. 7 includes two microphones 10 and 11 and two receivers 12 and 13 similar to the structure of FIG. 1. On main routes between the microphones and the receivers, a short-time Fourier transformer 100, a separation-matrix processor 101, and an inverse short-time Fourier transformer 102 are disposed in this order.

The simulations of FIGS. 5 and 6 are performed as follows. First, a mixed sound of a male voice and a female voice are inputted into the microphones 10 and 11. A separation processing is performed based on an observation signal x1 (n) of the microphone 10 and an observation signal x2 (n) of the microphone 11. Two separation signals y1 (n) and y2 (n) are generated as the results of the processing. FIGS. 5 and 6 indicate the respective waveforms of the observation signal (mixed sound) x1 (n), the separation signal (separated sound) y1 (n), and the separation signal (separated sound) y2 (n) in a range of a time period of 0 to 0.7 s. FIGS. 5 and 6 do not indicate a waveform of an original signal before mixing. The waveforms themselves of the separation signals y1 (n) and y2 (n) are mostly faithful to the original signal, and the problem is mainly a delay time.

First, in the comparative example in FIG. 5 relating to the conventional structure, the delay times of the separation signals y1 (n) and y2 (n) with respect to the observation signal x1 (n) are approximately 0.3 s (300 ms). In contrast, according to the working example in FIG. 6 relating to this embodiment, the delay times of the separation signals y1 (n) and y2 (n) with respect to the observation signal x1 (n) are significantly decreased, and confirmed to be approximately 0.01 s (10 ms).

The reasons why the significant decrease of the delay times can be achieved are as follows. That is, first, the update of the separation matrix W is performed on the side branch side. This restrains the delay on the main route. Furthermore, the filter-coefficient transformer 30 removes the non-causal components of the filter coefficients h (n) that have a comparatively little contribution to the sound source separation. Therefore, the employed structure of the sound source separation apparatus 1 of this embodiment ensures restraining the time lag between the input and the output (the time between the reach of the sound to the microphones 10 and 11 and the output of the sound from the receivers 12 and 13) while performing the data processing online. For example, the sound source separation apparatus 1 appropriate for applying to the hearing aid can be realized.

Figure 8:
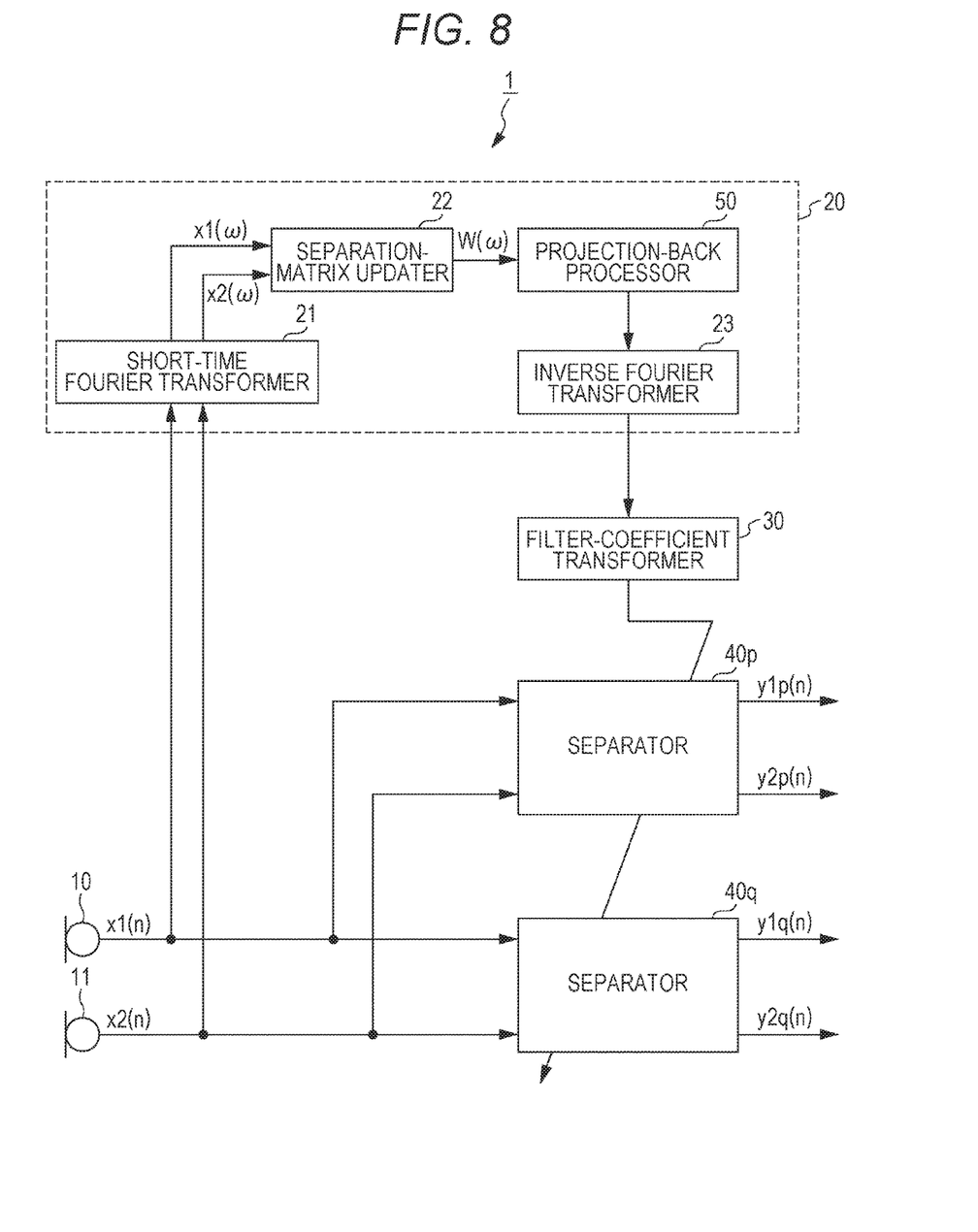
FIG. 8 is a block diagram illustrating a modification of the sound source separation apparatus of the embodiment.

Next, FIG. 8 illustrates a modification of the sound source separation apparatus 1 of this embodiment. In the modification illustrated in FIG. 8, a structure of what is called a projection back is assumed. This structure has a function not only simply separating the mixed sound collected by the two microphones 10 and 11, but also separating while maintaining localization information of the sound source like a stereo device. In the modification illustrated in FIG. 8, differences from FIG. 1 are as follows. The separation-matrix processor 20 additionally includes a projection-back processor 50 that performs a well-known data processing for applying the projection back to the separation matrix W (ω). Furthermore, two lines of routes, each of which includes a separator 40 (40$p$ or 40$q$) and a pair of the separation signals y1 (n) and y2 (n), are disposed.

That is, the two separators 40$p$ and 40$q$ each accept inputs of the two observation signals x1 (n) and x2 (n) from the two microphones. The filter-coefficient transformer 30 supplies the two separators 40$p$ and 40$q$ with the filter coefficients h (n) corresponding to the respective separators. Then, one separator 40$p$ outputs two separation signals y1p (n) and y2p (n). The other separator 40$q$ outputs two separation signals y1q (n) and y2q (n). Among these separation signals, a pair of the separation signals y1p (n) and y1q (n) obtains a localization of one sound source. A pair of the separation signals y2p (n) and y2q (n) obtains a localization of the other sound source.

The sound source separation apparatus 1 according to this embodiment has been described above. The present disclosure is applicable to various pieces of equipment. That is, as described above, the sound source separation apparatus 1 of this embodiment is applicable to the common hearing aid. Not limiting to this, the sound source separation apparatus 1 may be embedded in equipment other than the hearing aid (for example, a computer and a communication device) as a part of the equipment. The structure of this embodiment in FIG. 1 may be appropriately changed as long as similar functions are provided. For example, detailed process contents may be changed. A network communication or a wireless communication may be used for interconnections between the respective members. Besides, various structures and processing may be employed not limited to the contents of this embodiment.

The embodiments of the present disclosure may be the following first to seventh sound source separation apparatus.

The first sound source separation apparatus is a sound source separation apparatus that separates a mixed sound of a plurality of sound sources into sounds of the respective sound sources. The first sound source separation apparatus includes a plurality of microphones, a separation-matrix processor, a filter-coefficient transformer, and a separator. The plurality of microphones collects sounds to transform into respective electric signals, the sounds are propagated from the plurality of sound sources. The separation-matrix processor transforms a plurality of observation signals into a frequency-domain signal group, the plurality of observation signals are outputted from the plurality of microphones in time series, the separation-matrix processor updates a separation matrix for separating the sounds of the plurality of sound sources based on the frequency-domain signal group, and the separation-matrix processor transforms the updated separation matrix into time-series filter coefficients to output. The filter-coefficient transformer partially removes non-causal components included in the time-series filter coefficients to transform the filter coefficients. The separator supplies the filter coefficients to a filter group, the filter coefficients has been transformed by the filter-coefficient transformer, the filter group performs convolution processes of the plurality of observation signals, the separator generates a plurality of separation signals separated from the plurality of observation signals corresponding to the separation matrix.

The second sound source separation apparatus is the first sound source separation apparatus, and further includes a plurality of receivers that transforms each of the plurality of separation signals generated by the separator into sounds.

The third sound source separation apparatus is the first sound source separation apparatus, and the separation-matrix processor includes a short-time Fourier transformer, a separation-matrix updater, and an inverse Fourier transformer. The short-time Fourier transformer transforms each of the plurality of observation signals into the frequency-domain signal group. The separation-matrix updater updates the separation matrix based on the frequency-domain signal group. The inverse Fourier transformer transforms the separation matrix into the time-series filter coefficients.

The fourth sound source separation apparatus is the first sound source separation apparatus, and the filter-coefficient transformer includes a circular shifter and a filter-coefficient remover. The circular shifter performs circular shifts on the filter coefficients generated by the separation-matrix processor. The filter-coefficient remover removes a predetermined part of the non-causal components from the filter coefficient on which the circular shift has been performed.

The fifth sound source separation apparatus is the fourth sound source separation apparatus, and the filter-coefficient remover removes the predetermined part except a predetermined count of samples in time series near a center among the non-causal components.

The sixth sound source separation apparatus is the fifth sound source separation apparatus, and the predetermined count of the samples is set to a count of samples corresponding to a time period not exceeding 10 ms.

The seventh sound source separation apparatus is the first sound source separation apparatus, and the separator includes a plurality of FIR filters and a plurality of adders. The plurality of FIR filters corresponds to elements of the separation matrix. The plurality of adders adds outputs of the plurality of FIR filters corresponding to additions of separation processing with the separation matrix.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A sound source separation apparatus comprising:
a plurality of microphones that collects sounds to transform into electric signals, the sounds being propagated from a plurality of sound sources;
a separation-matrix processor that transforms a plurality of observation signals into a frequency-domain signal group, the plurality of observation signals being outputted from the plurality of microphones in time series, the separation-matrix processor updating a separation matrix configured to separate sounds of the plurality of sound sources based on the frequency-domain signal group, the separation-matrix processor transforming the updated separation matrix into time-series filter coefficients to output;
a filter-coefficient transformer that partially removes non-causal components from the filter coefficients to transform the filter coefficients, the non-causal components being included in the time-series filter coefficients; and
a separator that supplies the transformed filter coefficients to a filter group, the transformed filter coefficients having been obtained by the transformation by the filter-coefficient transformer, the filter group performing convolution processes of the plurality of observation signals, the separator generating a plurality of separation signals separated from the plurality of observation signals corresponding to the separation matrix,
wherein the filter-coefficient transformer includes:
a circular shifter that performs circular shifts on the filter coefficients generated by the separation-matrix processor; and
a filter-coefficient remover that removes a predetermined part of the non-causal components from the filter coefficients on which the circular shift has been performed.

2. The sound source separation apparatus according to claim 1, further comprising
a plurality of receivers that transforms each of the plurality of separation signals generated by the separator into sounds.

3. The sound source separation apparatus according to claim 1, wherein the separation-matrix processor includes:
a short-time Fourier transformer that transforms each of the plurality of observation signals into the frequency-domain signal group;
a separation-matrix updater that updates the separation matrix based on the frequency-domain signal group; and
an inverse Fourier transformer that transforms the separation matrix into the time-series filter coefficients.

4. The sound source separation apparatus according to claim 1, wherein
the filter-coefficient remover removes the predetermined part so as to leave a predetermined count of samples in time series near a center among the non-causal components.

5. The sound source separation apparatus according to claim 4, wherein
a count of the predetermined count of the samples is set to a count of samples corresponding to a time period not exceeding 10 ms.

6. The sound source separation apparatus according to claim 1, wherein
the separator includes:
a plurality of FIR filters corresponding to elements of the separation matrix; and
a plurality of adders that add outputs of the plurality of FIR filters corresponding to additions of separation processing with the separation matrix.

* * * * *